United States Patent
Argento (10) Patent No.: US 9,484,320 B2
(45) Date of Patent: Nov. 1, 2016

(54) VERTICALLY PACKAGED INTEGRATED CIRCUIT

(75) Inventor: Christopher W. Argento, Dripping Springs, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/458,224

(22) Filed: Apr. 27, 2012

(65) Prior Publication Data

US 2013/0285220 A1 Oct. 31, 2013

(51) Int. Cl.
*H01L 23/495* (2006.01)
*H01L 23/00* (2006.01)
*H01L 23/433* (2006.01)

(52) U.S. Cl.
CPC ........... *H01L 24/49* (2013.01); *H01L 23/4334* (2013.01); *H01L 23/4951* (2013.01); *H01L 23/49517* (2013.01); *H01L 23/49537* (2013.01); *H01L 23/49568* (2013.01); *H01L 24/73* (2013.01); *H01L 24/16* (2013.01); *H01L 24/48* (2013.01); *H01L 2224/13009* (2013.01); *H01L 2224/16225* (2013.01); *H01L 2224/16227* (2013.01); *H01L 2224/16245* (2013.01); *H01L 2224/32245* (2013.01); *H01L 2224/4824* (2013.01); *H01L 2224/48091* (2013.01); *H01L 2224/48227* (2013.01); *H01L 2224/48247* (2013.01); *H01L 2224/4918* (2013.01); *H01L 2224/49175* (2013.01); *H01L 2224/73253* (2013.01); *H01L 2924/00014* (2013.01); *H01L 2924/181* (2013.01)

(58) Field of Classification Search
USPC ................................ 257/666–677
See application file for complete search history.

(56) References Cited

U.S. PATENT DOCUMENTS

| | | | | |
|---|---|---|---|---|
| 4,209,798 A | * | 6/1980 | Beretta | H01L 23/3107 174/16.3 |
| 5,576,577 A | * | 11/1996 | Takenouchi | H01L 23/49589 257/672 |
| 5,592,019 A | * | 1/1997 | Ueda | H01L 21/565 257/666 |
| 5,708,297 A | * | 1/1998 | Clayton | 257/723 |
| 5,965,937 A | | 10/1999 | Chiu et al. | |
| 6,414,385 B1 | * | 7/2002 | Huang | H01L 23/3114 257/690 |
| 6,765,291 B2 | | 7/2004 | Corisis | |
| 7,372,151 B1 | * | 5/2008 | Fan et al. | 257/738 |
| 7,737,548 B2 | | 6/2010 | Gomez | |
| 7,894,199 B1 | * | 2/2011 | Chang | H01L 23/49822 174/262 |
| 2004/0169272 A1 | * | 9/2004 | Hembree | 257/712 |
| 2009/0278244 A1 | * | 11/2009 | Dunne et al. | 257/676 |
| 2010/0148353 A1 | * | 6/2010 | Kim et al. | 257/698 |
| 2011/0024888 A1 | * | 2/2011 | Pagaila et al. | 257/686 |

* cited by examiner

*Primary Examiner* — Andy Huynh
*Assistant Examiner* — Sitaramarao S Yechuri (57) ABSTRACT

A device comprises a semiconductor package including a first integrated circuit (IC) die including a plurality of through silicon vias (TSVs). The TSVs are formed of conductive material that extend through the first IC die from an outer surface on a first side of the die to an outer surface of a second side of the die. The package further includes first electrical connections contacting the first side of the first IC die, and second electrical connections contacting the second side of the first IC die. The first electrical connections are independent of the second electrical connections. Molding compound encapsulates the first IC die and the first and second electrical connections. The semiconductor package is mounted on a substrate so that the first and second sides of the IC die are oriented perpendicular to the substrate.

13 Claims, 6 Drawing Sheets

VERTICALLY PACKAGED INTEGRATED CIRCUIT

BACKGROUND

1. Field

This disclosure relates generally to packaged integrated circuits, and more specifically, to vertically packaged integrated circuits.

2. Related Art

Heat dissipation continues to be a significant issue with integrated circuits. With the number of transistors increasing per unit area, the number of heat generating actions increase for a given area. Thus, the area available for heat dissipation is constant while the heat generated in that area may increase. With horizontal packaging, one major surface is very close to a printed circuit and thus heat is difficult to dissipate in that direction. With vertical packaging, both major surfaces may be relatively unconstrained which allows for greater potential for heat dissipation. A major factor that results in pin count restraints on with vertically packaged integrated circuits is the limited routing to the printed circuit board. Also reliability and effective mounting to the printed circuit board are issues.

Thus, there is a need for a vertically packaged integrated circuit that improves upon one or more of the issues described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A vertically packaged integrated circuit uses through vias through the integrated circuit so that interconnect can be connected to the top major surface of the integrated circuit using, for example, wire bonding and that interconnect can also be connected to the bottom surface. This allows for more routing and thus a higher pin count while retaining heat dissipation on both major surfaces and higher reliability. This is better understood by reference to the drawings and the following written description.

Figure 1:
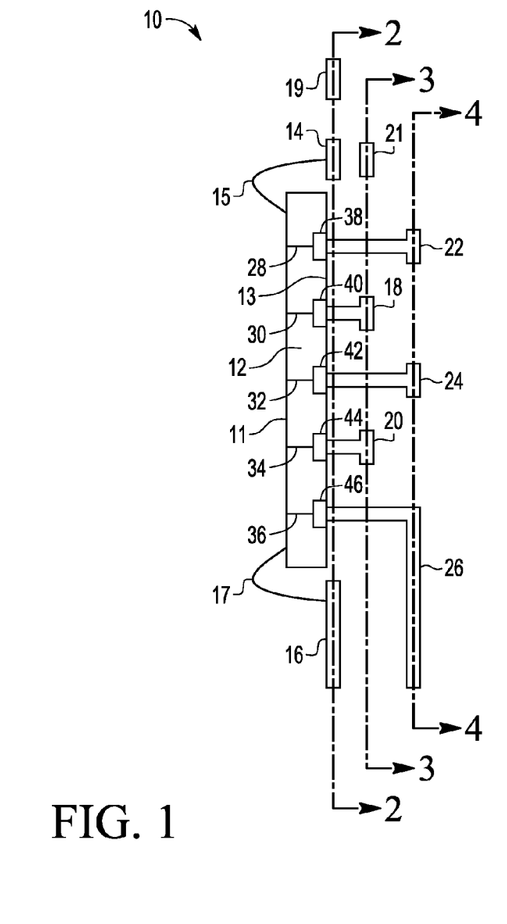
FIG. 1 is a side view of a vertically packaged integrated circuit according to an embodiment.

Shown in FIG. 1 is a side view of vertically packaged integrated circuit 10 having an integrated circuit 12, bond pads 14, 16, and 19 in a first level of metal for use with wire bonds, interconnect lines 18, 20, and 21 in a second level of metal for connecting to through vias; and interconnect lines 22, 24, and 26 in a third level of metal for connecting to through vias. Integrated circuit 12 includes through vias 28, 30, 32, 34 and 36 extending from a first major surface 11 to contacts 38, 40, 42, 44, and 46, respectively, on a second major surface 13 of integrated circuit 12. First major surface 11 is where transistors are formed and may be called the active surface or the top surface. Second major surface 13 may be called the bottom surface. Bond pad 14 is wire bonded to the top surface of integrated circuit 12 by a wire 15. Bond pad 16 is wire bonded to the top surface of integrated circuit 12 by a wire 17. Bond pad 19 is wired bonded to the top surface of integrated circuit 12 by a wire that is not shown in FIG. 1. Cross sectional lines 2-2, 3-3, and 4-4 show where subsequent FIGS. 2-4, which are cross sectional views, are taken. Vertically packaged means that the major surface of vertically packaged integrated circuit 10 is substantially orthogonal to the surface on which it is to be mounted. Through vias such as through vias 28, 30, 32, 34, and 36 have commonly been referenced as through silicon vias (TSVs) because typically the substrate is silicon, but even though referenced as TSVs or through silicon vias the application is not limited to such substrates. That is to say, even if the substrate is not silicon, such substrate could have a through silicon via (TSV). A collection of bond pads and interconnect lines such as present in FIG. 1 may be called a lead frame. The various elements may be linked together in some form until encapsulation. An integrated circuit may be referenced as an IC.

Figure 2:
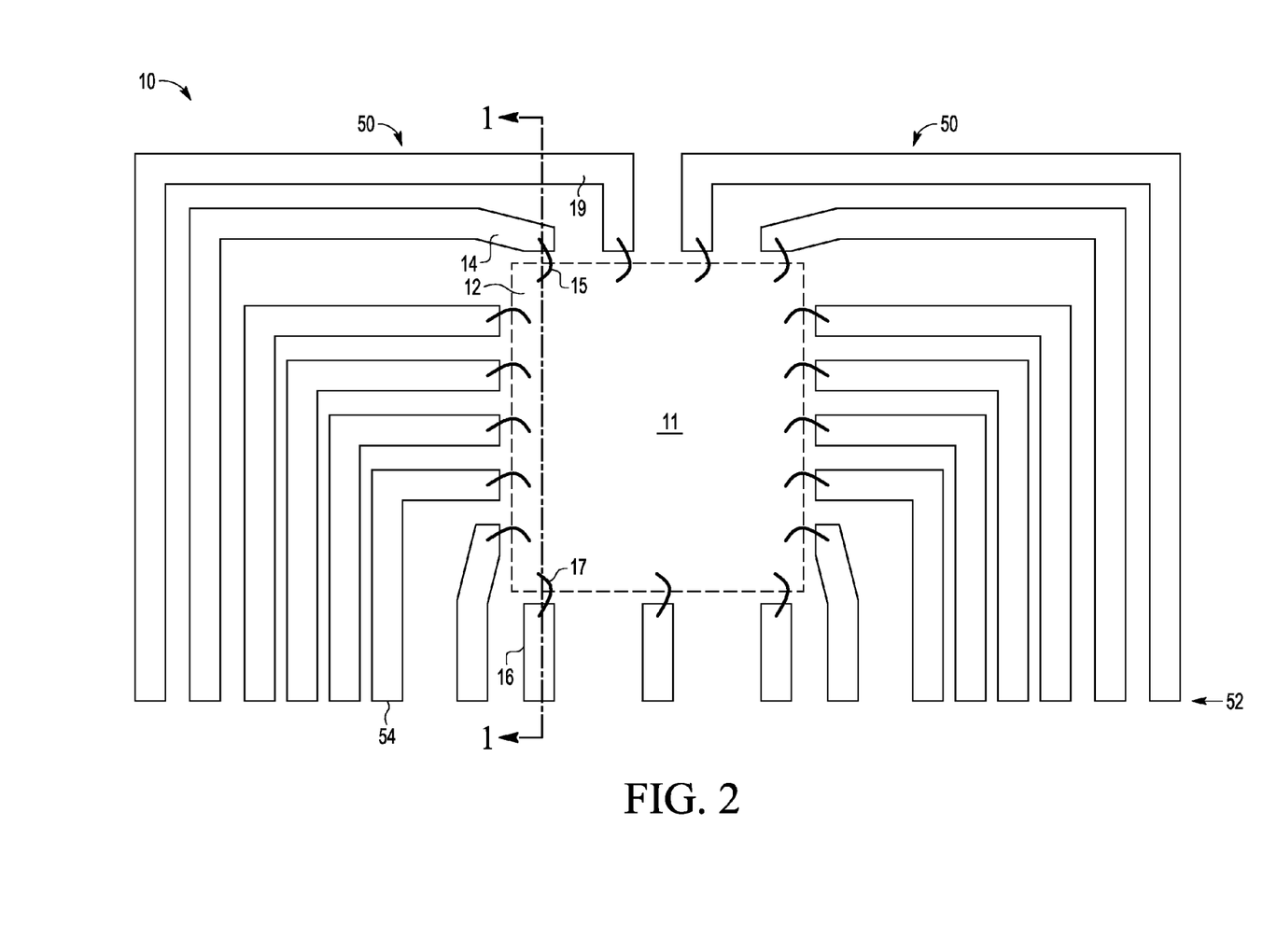
FIG. 2 is a first cross section of the vertically packaged integrated circuit of FIG. 1.

Shown in FIG. 2 is vertically packaged integrated circuit 10 showing a plurality of bonding pads 50 including bonding pads 14, 16, and 19 also shown in FIG. 1. A dotted line of the location of integrated circuit 12 and the corresponding top surface 11 are also shown. Also shown are representative wires 15 and 17 from FIG. 1. The line 1-1 shows where the side view, which may also be considered a cross section, that is FIG. 1 is in relation to FIG. 2. This shows plurality of bond pads 50 around integrated circuit 12 which in turn shows that efficient use is made of the perimeter of integrated circuit 12 in forming bond pads. Bond pads 50 all terminate along a bottom line 52 of which termination 54 is an example. At termination line 52 bond pads 50 are for entering a connector that has multiple rows of connection points.

Figure 3:
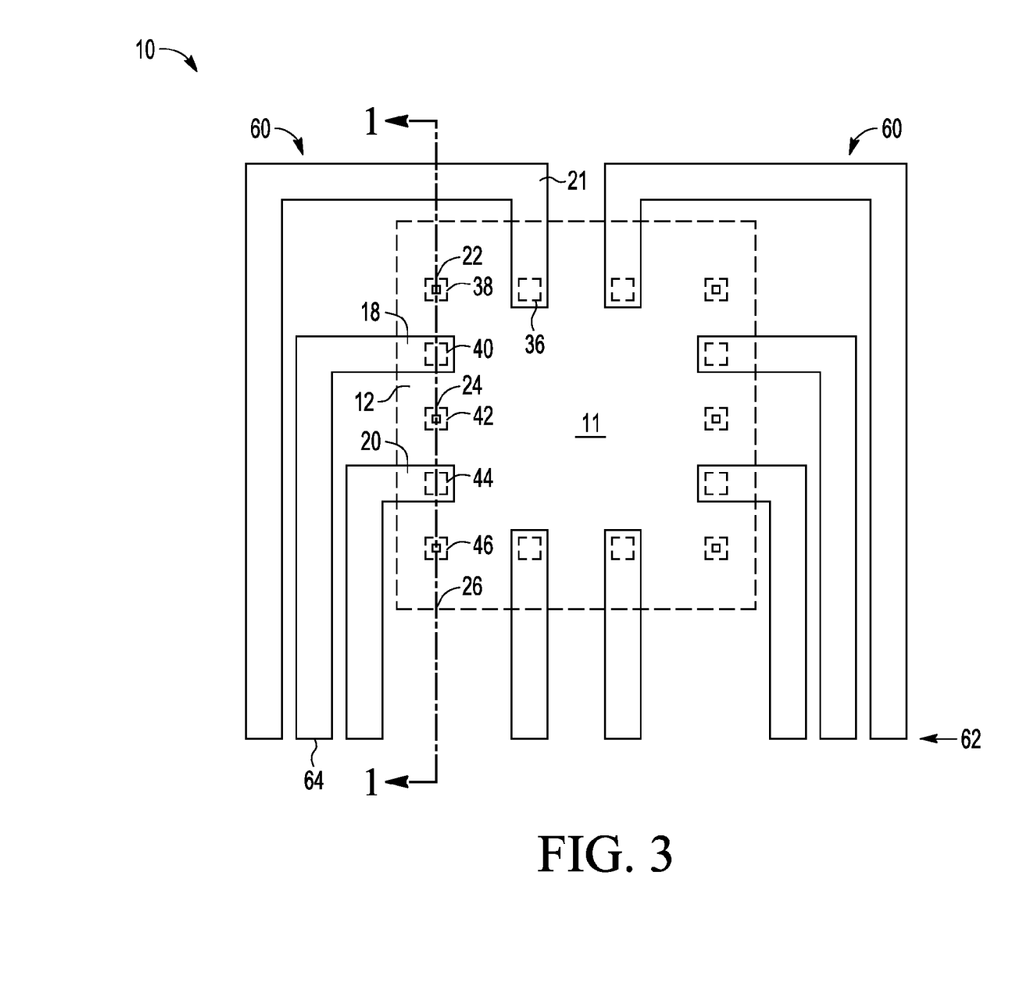
FIG. 3 is a second cross section of the vertically packaged integrated circuit of FIG. 1.

Shown in FIG. 3 is vertically packaged integrated circuit 10 showing a plurality of interconnect lines 60 including interconnect lines 18, 20, and 21. A dotted line of the location of integrated circuit 12 and the corresponding top surface 11 are also shown as are through hole contacts 38, 40, 42, 44, and 46. The line 1-1 shows where the side view shown in FIG. 1, which may also be considered a cross section, is in relation to FIG. 3. This shows plurality of interconnect lines 60 around integrated circuit 12 which in turn shows that efficient use is made of the perimeter of integrated circuit 12 in forming interconnect lines. More interconnect lines may be used than shown. Interconnect lines 60 all terminate along a bottom line 62 of which termination 64 of interconnect line 18 is an example. At termination line 62 interconnect lines 60 are for entering the connector that has multiple rows of connection points.

Interconnect lines 60 would connect to a row parallel to the row of connection points for bond pads 50 shown in FIG. 2.

Figure 4:
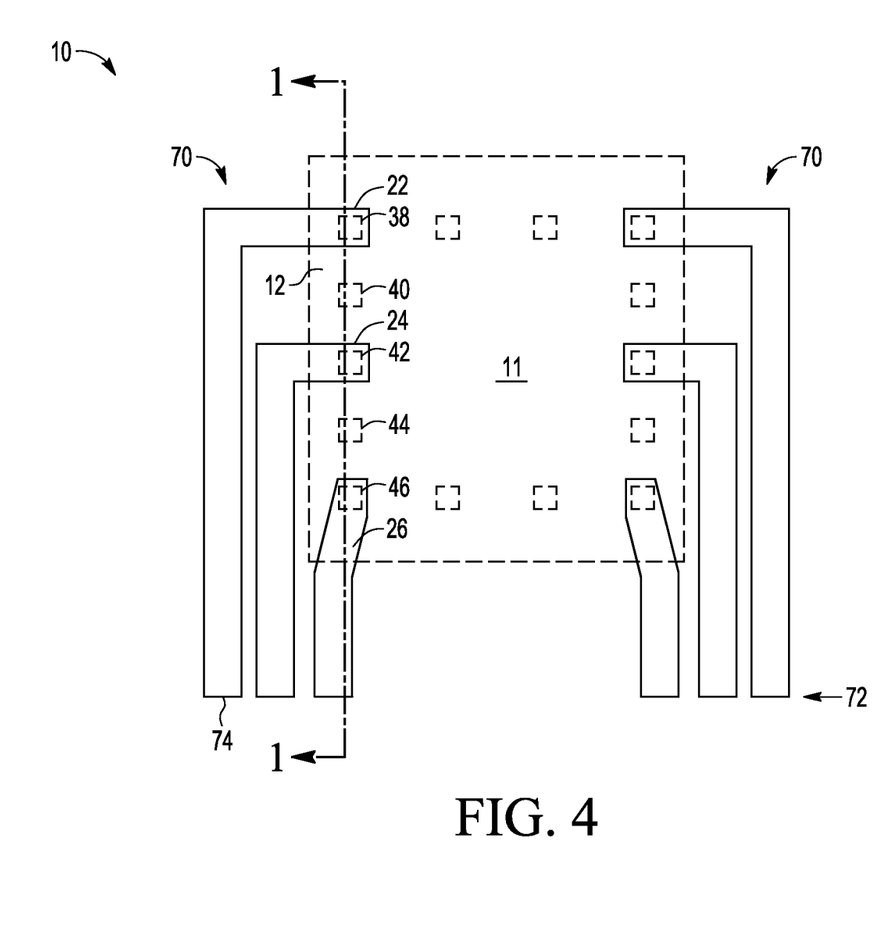
FIG. 4 is a third cross section of the vertically packaged integrated circuit of FIG. 1.

Shown in FIG. 4 is vertically packaged integrated circuit 10 showing a plurality of interconnect lines 70 including interconnect lines 22, 24, and 26. A dotted line of the location of integrated circuit 12 and the corresponding top surface 11 are also shown as are through hole contacts 38, 40, 42, 44, and 46. The line 1-1 shows where the side view of FIG. 1, which may also be considered a cross section, is in relation to FIG. 4. This shows plurality of interconnect lines 70 around integrated circuit 12 which in turn shows that efficient use is made of the perimeter of integrated circuit 12 in forming interconnect lines. More interconnect lines may be used than shown. Interconnect lines 70 all terminate along a bottom line 72 of which termination 74 of interconnect line 22 is an example. At termination line 72 interconnect lines 70 are for entering the connector that has multiple rows of connection points. Interconnect lines 60 would connect to a row parallel to and adjacent to the row of connection points for interconnect lines 60.

Figure 5:
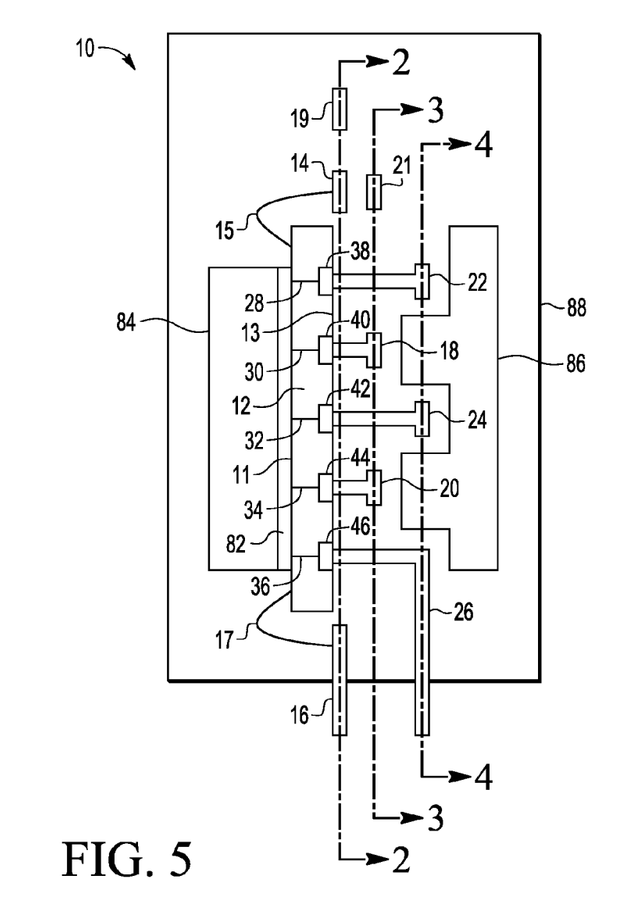
FIG. 5 is a side view of the vertically packaged integrated circuit of FIG. 1 after subsequent processing.

Shown in FIG. 5 is vertically packaged integrated circuit 10 after forming a dielectric layer 82 on top surface 11, a heat spreader 84 on dielectric layer 82, a heat sink on back side 13 conformal with but spaced from interconnect layers 22, 18, 24, and 20, and an encapsulant 88 around heat spreaders 84 and 86 with the result that vertically packaged integrated circuit 10 is a completed vertically packaged integrated circuit ready to be inserted into a connector or otherwise mounted vertically. A thermal interface material (TIM) may be used to maintain thermal contact of heat spreaders 84 and 86 with integrated circuit 12. Through vias have been described as being for use as making electrical connections to the bottom surface, opposite surface 11, of the integrated circuit. Through vias may also be used for increasing thermal transmission to the bottom surface of the integrated circuit where it can be further transmitted to the bottom side heat spreader, heat spreader 86.

Figure 6:
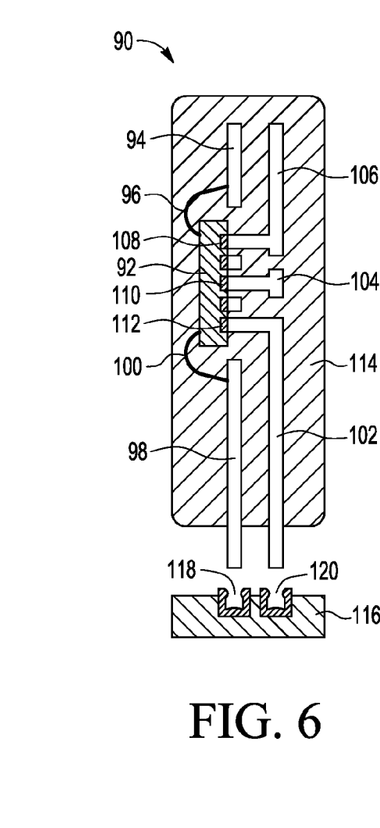
FIG. 6 is a simplified form of the vertically packaged integrated circuit of FIGS. 1-5 with a connector depicting the manner of a vertical connection thereto.

Shown in FIG. 6 is a vertically packaged integrated circuit 90 substantially similar to vertically packaged integrated circuit 90 in simplified form having an integrated circuit 92 wired bonded to bond pads 94 and 98 from a top side of integrated circuit 92 with wires 96 and 100, respectively, interconnect lines 102, 104, and 106 connected to through hole pads 108, 110, and 112, respectively, and an encapsulant 114 around integrated circuit 92, bond pads 94 and 98 except terminal portions thereof, and around interconnect lines 102, 104, and 106 except terminal portions thereof. The terminal portions of interconnect lines 102, 104, an 106, extend to a connector 116 as do the terminal portions of bond pads 94 and 98. The terminal portions of bond pad 94 and interconnect lines 104 and 106 are not shown in FIG. 6. As shown, interconnect line 102 extends to an opening 120 of connector 116, and interconnect line 98 extends to an opening 118 of connector 116. This is the side view similar to FIG. 1. Many other connectors not shown in this view would extend from encapsulation 114 to attach to connector 116.

Figure 7:
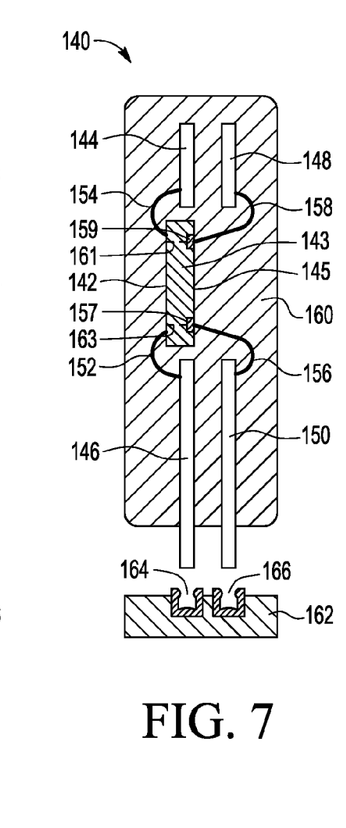
FIG. 7 is a vertically packaged integrated circuit similar to the vertically packaged integrated circuit of FIGS. 1-5 depicting wire bonding on both major surfaces and also with a connector depicting the manner of a vertical connection thereto.

Another possibility is to provide a vertically packaged integrated circuit in which wire bonding was performed on the bottom and top of the integrated circuit as shown in simplified form in FIG. 7 as a vertically packaged integrated circuit 140 that has an integrated circuit 142 with a top surface 143 and a bottom surface 145, a bond pad 144 and a bond pad 146 at a first level for wire bonding to top surface 143 using a wire 154 and a wire 152, respectively, a bond pad 148 and a bond pad 150 at a second level for wire bonding to bottom surface 145 using wires 156 and 158, respectively. Wires 156 and 158 are connected to through via pads 157 and 159, respectively. Also shown are through vias 161 and 163 extending from top surface 143 to through via pads 159 and 157, respectively. Vertically packaged integrated circuit 140 is encapsulated with an encapsulant 160 except for terminal portions of the bond pads which are exemplified by bond pads 146 and 150 which are shown with their terminal ends extending from encapsulant 160 that align to openings 164 and 166 of connector 162. Terminal ends of bond pads 144 and 148 are not shown in this view but do extend below encapsulant 160 and align to openings in connector 162. A plurality of connecting points are aligned with each opening shown. Thus there two parallel lines of connecting points; one with regard to each of openings 164 and 166. Encapsulant may also be referenced as molding compound.

Figure 8:
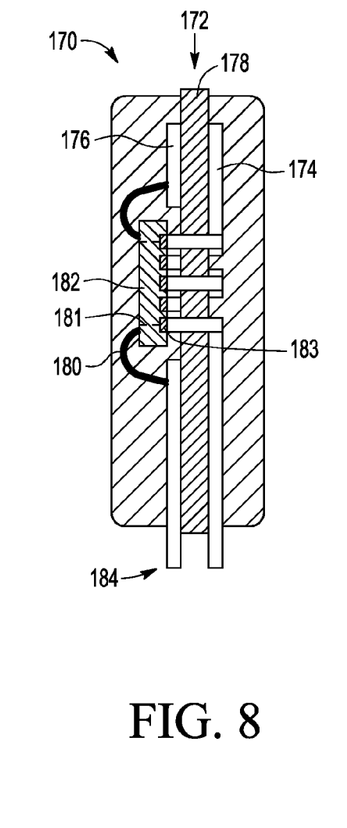
FIG. 8 is a vertically packaged integrated circuit of the same form as the vertically packaged integrated circuit of FIGS. 1-5 but using a substrate in the formation thereof.
Figure 9:
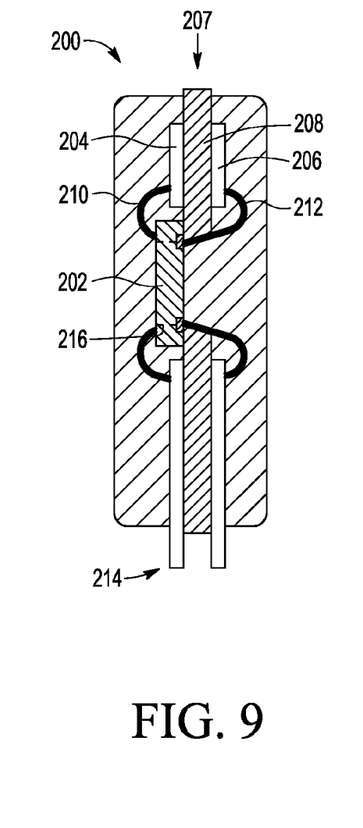
FIG. 9 is a vertically packaged integrated circuit of the same form as the vertically packaged integrated circuit of FIG. 7 but using a substrate in the formation thereof.

A way to simplify the manufacturing is to form the interconnect lines and bond pads in a package substrate and then connect the package substrate to the bottom side of the die wherein through via pads are used to provide connection to the substrate. The connection can be by pad or by wire bond. One example is shown in FIG. 8 which is similar to that shown in FIGS. 1-6 and another example is shown in FIG. 9 which is similar to that shown in FIG. 7. Shown in FIG. 8 is a vertically packaged integrated circuit 170 having an integrated circuit 182 with its bottom surface mounted to a substrate 172 which includes a bond pad layer 176 at a top surface of the substrate and an interconnect layer 174 at a bottom surface of the substrate, and a dielectric layer 178 between interconnect layer 174 and bond pad layer 176 and providing physical support. Also shown is an exemplary through via 181 from a top surface of integrated circuit 182 to a through via pad 183 on the bottom surface of integrated circuit 182. Exemplary bond pads 184 are attached to the bond pad layer. Shown in FIG. 9 is a vertically packaged integrated circuit 200 having an integrated circuit 202 mounted on a substrate 207 having a top wire bonding layer 204, a bottom wire bonding layer 206 and a dielectric layer 208 in between that provides physical support. As in all of the FIGS. 1-8, through vias, of which through via 216 is one, extend through integrated circuit 202. Wire bonding then proceeds from both the top and bottom of integrated circuit to the top and bottom of substrate 207. Exemplary bond pads 214 are attached to the bond pad layer.

In each example, heat sinks may be added in similar manner to that shown in FIG. 5. Thus, there is the capability to provide heating sinking on each major surface because of the vertically packaged integrated circuits. Thus heat is dissipated and with the through vias providing connectability on from both sides of the integrated circuit the pin count can be raised.

By now it should be appreciated that there has been provided a device including a semiconductor package. The semiconductor package includes a first integrated circuit (IC) die including a plurality of through silicon vias (TSVs), wherein the TSVs are formed of conductive material that extend through the first IC die from an outer surface on a first side of the die to an outer surface of a second side of the die. The semiconductor package further includes first electrical connections contacting the first side of the first IC die. The semiconductor package further includes second electrical connections contacting the second side of the first IC die, wherein the first electrical connections are independent of the second electrical connections. The semiconductor package further includes molding compound encapsulating the first IC die and the first and second electrical connections. The device further includes a substrate, the semiconductor package being mounted on the substrate so that the first and second sides of the IC die are oriented perpendicular to the substrate. The device may further include a leadframe, wherein the first side of the first IC die is mounted on the leadframe. The device may further include a leadframe connected to the first electrical connections, wherein a portion of the leadframe is encapsulated in the molding compound and an edge of the leadframe extends outside of the molding compound. The device may further include a socket in the substrate, wherein the edge of the leadframe is engaged in the socket. The device may further include a mounting member coupled to the semiconductor package, wherein the mounting member is coupled to the substrate. The device may further include one of the group consisting of: (i) a heat spreader coupled to the first side of the first IC die and (ii) a first heat spreader coupled to the first side of the first IC die and a second heat spreader coupled to the second side of the first IC die. The device may have a further characterization by which the semiconductor package is soldered to the substrate. The device may have a further characterization by which the leadframe includes two or more layers, the package further includes a second substrate between the layers of the leadframe. The device may have a further characterization by which the first electrical connections are wirebonds. The device may have a further characterization by which the second electrical connections are wirebonds. The device may have a further characterization by which a portion of the second substrate extends outside the molding compound and is used to attach the semiconductor package to the substrate.

Also disclosed is processing device that includes an integrated circuit (IC) package. The IC package includes a leadframe. The IC package further includes an integrated circuit (IC) die having a top side, a bottom side, and through silicon vias (TSVs) extending from the top side to the bottom side, the TSVs at the bottom side of the IC die are electrically connected to the leadframe. The IC package further includes wirebonds attached between the TSVs at the top side of the IC die and the leadframe. The IC package further includes molding compound encapsulating the IC die, the wirebonds, and at least a portion of the leadframe. The processing system further includes a substrate, wherein the IC package is mounted on the substrate so that a side of the IC package with the thinnest cross-section is parallel to a surface of the substrate. The processing system may further comprise three sides of the leadframe are encapsulated in the molding compound, and a second portion of the leadframe is external to the molding compound, wherein the IC package is mounted to the substrate at the second portion of the lead frame. The processing system may further comprise a second substrate formed around the leadframe. The processing system may further comprise a heat spreader mounted to the top side of the die. The processing system may further comprise wirebonds attached between the bottom side of the IC die and the leadframe. The processing system may further comprise a socket in the substrate, wherein an edge of the IC package is engaged in the socket. The processing system may have a further characterization by which the IC package is soldered to the substrate Disclosed also is a method including mounting a semiconductor package on a substrate so that a top and a bottom side of a semiconductor package with a largest surface area compared to other sides of the semiconductor package are oriented perpendicular to a top surface of the substrate. The semiconductor package includes a leadframe and a semiconductor die mounted on the leadframe. The semiconductor die includes through silicon vias (TSVs) extending from an outer surface of the top side of the semiconductor die to an outer surface of the bottom side of the die. The semiconductor package further includes electrical connections between the TSVs in the semiconductor die and the leadframe. The method may further comprise mounting a heat spreader on the semiconductor die.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the dielectric material between conductive layers may extend to cover portions of the conductive layers as well. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:
1. A semiconductor package comprising:
 a first integrated circuit (IC) die including a plurality of through silicon vias (TSVs), wherein the TSVs are formed of conductive material that extend through the first IC die from an active surface of the die to a bottom surface of the die;
 a dielectric layer formed over the active surface of the first IC die;
 a first heat spreader formed over the dielectric layer;
 a first level of conductive lines coupled to the active surface of the first IC die, wherein the first level of conductive lines are arranged in a first plane substantially parallel to the active surface and extend to a first termination line outside a first edge of the IC die;
 a second level of conductive lines coupled to the TSVs at the bottom surface of the first IC die inside the perimeter of the die, wherein the second level of conductive lines are arranged in a second plane substantially parallel to the first plane and extend outside the perim- eter of the die to a second termination line outside the first edge of the IC die, the second plane spaced apart from the first plane;

a second heat spreader coupled to the bottom surface of the die, the second heat spreader conformal with and spaced from the first and second levels of conductive lines; and a molding compound encapsulating the first IC die and portions of the first and second levels of conductive lines, wherein the first and second termination lines extend outside the molding compound; and wherein the first and second levels of conductive lines at the first and second termination lines are configured to connect to a mounting surface, the semiconductor package to mount on the mounting surface so that the active surface and the bottom surface of the IC die are oriented perpendicular to the mounting surface.

2. The semiconductor package of claim 1, further characterized by: the first and second levels of conductive lines at the first and second termination lines are configured to connect to a socket in the mounting surface.

3. The semiconductor package of claim 1, wherein the first heat spreader comprises a metal layer on the dielectric layer.

4. The device of claim 1, wherein the first electrical connections are wirebonds.

5. The device of claim 4, wherein the second electrical connections are wirebonds.

6. The semiconductor package of claim 1, further comprising a third level of conductive lines coupled to the bottom surface of the first IC die inside the perimeter of the die, wherein the third level of conductive lines are arranged in a third plane substantially parallel to the first and second planes and extends outside the perimeter of the die to a third termination line outside the first edge of the IC die, wherein the third level of conductive lines are spaced further from the bottom surface than the second level of conductive lines.

7. A processing device comprising:
an integrated circuit (IC) package including:
a leadframe having a first level of interconnect lines arranged in a first plane and a second level of interconnect lines arranged in a second plane substantially parallel to the first plane, the second plane spaced apart from the first plane;
an integrated circuit (IC) die having a top side, a bottom side, and through silicon vias (TSVs) extending from the top to the bottom side, the top side substantially parallel to the first level of interconnect lines, wherein the TSVs at the bottom side of the IC die are electrically connected to the first level of interconnect lines;
wirebonds attached between the top side of the IC die and the second level of interconnect lines; and
molding compound encapsulating the IC die, the wirebonds, and at least a portion of the first and second levels of interconnect lines of the leadframe, the first and second levels of interconnect lines extend to respective first and second termination lines outside a first edge of the IC die;

a first heat sink attached to a dielectric layer formed over the top side of the IC die;
a second heat sink within the molding compound and over the bottom side the second heat sink conformal with and spaced from the leadframe; and
a substrate, wherein the IC package is mounted on the substrate so that a side of the IC package with the thinnest cross-section is parallel to a surface of the substrate.

8. The processing device of claim 7, further comprising:
three sides of the leadframe are encapsulated in the molding compound, and a second portion of the leadframe is external to the molding compound, wherein the IC package is mounted to the substrate at the second portion of the lead frame.

9. The processing device of claim 8, further comprising:
a second substrate formed around the leadframe.

10. The processing system of claim 8, further comprising:
a socket in the substrate, wherein an edge of the IC package is engaged in the socket.

11. The processing system of claim 8, wherein the IC package is soldered to the substrate.

12. The processing device of claim 7, further comprising:
wirebonds attached between the bottom side of the IC die and the leadframe.

13. A method comprising:
mounting a semiconductor package on a substrate so that a top and a bottom side of a semiconductor package with a largest surface area compared to other sides of the semiconductor package are oriented perpendicular to a top surface of the substrate, wherein the semiconductor package includes:
a leadframe having a first level of interconnect lines arranged in a first plane and a second level of interconnect lines arranged in a second plane substantially parallel to the first plane, the second level of interconnect lines separated from the first level of interconnect lines;
a semiconductor die mounted on the leadframe, the semiconductor die includes through silicon vias (TSVs) extending from an outer surface of the top side of the semiconductor die to an outer surface of the bottom side of the die, the top side of the semiconductor die substantially parallel to the first level of interconnect lines;
encapsulation surrounding the semiconductor die and a portion of the leadframe, the first and second levels of interconnect lines extend to respective first and second termination lines outside a first edge of the semiconductor die;
a first heat sink over a dielectric layer formed over the top side and within the encapsulation;
a second heat sink under the bottom side and within the encapsulation, the second heat sink conformal with and spaced from the leadframe; and electrical connections between the TSVs at the bottom side of the semiconductor die and the first level of interconnect lines, and between the top side of the semiconductor die and the second level of interconnect lines.

* * * * *